(12) United States Patent
Gomm

(10) Patent No.: US 10,840,913 B2
(45) Date of Patent: Nov. 17, 2020

(54) CIRCUITS, APPARATUSES, AND METHODS FOR FREQUENCY DIVISION

(71) Applicant: MICRON TECHNOLOGY, INC., Boise, ID (US)

(72) Inventor: Tyler J. Gomm, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/220,489

(22) Filed: Dec. 14, 2018

(65) Prior Publication Data

US 2019/0123748 A1 Apr. 25, 2019

Related U.S. Application Data

(63) Continuation of application No. 15/644,401, filed on Jul. 7, 2017, now Pat. No. 10,164,642, which is a continuation of application No. 13/418,166, filed on Mar. 12, 2012, now Pat. No. 9,748,959.

(51) Int. Cl.
*H03K 21/38* (2006.01)

(52) U.S. Cl.
CPC .................................. *H03K 21/38* (2013.01)

(58) Field of Classification Search
CPC ......... H03K 23/44; H03K 23/60; H03K 21/38
See application file for complete search history.

(56) References Cited

U.S. PATENT DOCUMENTS

| | | |
|---|---|---|
| 6,049,236 A | 4/2000 | Walden |
| 6,181,180 B1 | 1/2001 | Chen et al. |
| 6,483,888 B1 | 11/2002 | Boerstler et al. |
| 6,492,852 B2 | 12/2002 | Fiscus |
| 6,975,149 B2 | 12/2005 | Mikhalev et al. |
| 7,164,302 B1 | 1/2007 | Elkin |
| 7,180,341 B2 | 2/2007 | Harada et al. |
| 7,538,590 B2 | 5/2009 | Lin |
| 7,764,096 B2 | 7/2010 | Lee et al. |
| 7,956,659 B2 | 6/2011 | You et al. |
| 8,018,257 B2 | 9/2011 | Jung |
| 9,748,959 B2 | 8/2017 | Gomm |
| 10,164,642 B2 | 12/2018 | Gomm |
| 2009/0230999 A1 | 9/2009 | Lin |
| 2012/0133408 A1 | 5/2012 | Bazes |
| 2013/0234763 A1 | 9/2013 | Gomm |
| 2017/0310325 A1 | 10/2017 | Gomm |

*Primary Examiner* — Lincoln D Donovan
*Assistant Examiner* — Colleen J O Toole
(74) *Attorney, Agent, or Firm* — Dorsey & Whitney LLP

(57) ABSTRACT

Circuits, apparatuses, and methods are disclosed for frequency division. In one such example circuit, a frequency divider is configured to alternate between providing a common frequency clock signal as an output clock signal through a first circuit responsive to a reference clock signal and providing a reduced frequency clock signal as the output clock signal through a second circuit responsive to the reference clock signal. The first and second circuits share a shared circuit through which the output clock signal is provided. An enable circuit is configured to cause the frequency divider to alternate between providing the common frequency clock signal as the output clock signal through the first circuit and the reduced frequency clock signal as the output clock signal through the second circuit.

19 Claims, 7 Drawing Sheets

CIRCUITS, APPARATUSES, AND METHODS FOR FREQUENCY DIVISION

CROSS-REFERENCE TO RELATED APPLICATION(S)

This application is a continuation of U.S. patent application Ser. No. 15/644,401 filed Jul. 7, 2017 and issued as U.S. Pat. No. 10,164,642 on Dec. 25, 2018, which application is a continuation of U.S. patent application Ser. No. 13/418,166 filed Mar. 12, 2012 and issued as U.S. Pat. No. 9,748,959 on Aug. 29, 2017. The aforementioned applications, and issued patents, are incorporated herein by reference, in their entirety, for any purpose.

TECHNICAL FIELD

Embodiments of the invention relate generally to integrated circuits, and more particularly, in one or more of the illustrated embodiments, to frequency division.

BACKGROUND OF THE INVENTION

Frequency dividers are commonly used to reduce the frequency of a clock signal in an integrated circuit by a factor of an integer, for example, 2, 3, 4, 6, and so forth. The reduced frequency clock signal may be used, for example, in a circuit that cannot operate at the reference clock signal frequency and instead operates at a lower frequency (e.g., a memory).

The reduced frequency clock signal may also be used in a circuit that can operate at the reference clock signal frequency, but that alternatively operates at a reduced frequency—for example in a low-power mode of operation. The selective use of the reduced frequency in these circuits allows for lower dynamic power consumption because of the less frequent transitioning of the clock signal, while still allowing a clock signal with the same frequency as the reference clock signal to be used when needed. In those devices that selectively use such a reduced frequency, a frequency divider or other circuit may be needed that can alternate between providing a common frequency clock signal (e.g., a clock signal that has the same frequency as the reference clock signal) and the reduced frequency clock signal. A circuit such as a multiplexer can be used in the frequency divider to select between providing the common frequency clock signal and the reduced frequency clock signal.

In providing the reduced frequency clock signal, the frequency divider typically, introduces a propagation delay into the reduced frequency clock signal path as compared with the common frequency clock signal path. If the propagation delay of the reduced frequency clock signal is different than the propagation delay of the common frequency clock signal, a circuit that alternatingly receives the reduced frequency clock signal and the common frequency clock signal may not operate as intended due to the common frequency, clock signal being out of phase with the reduced frequency clock signal. In order to try to match the delay of the common frequency clock signal propagation path with the reduced frequency clock signal propagation path, a model delay element can be used in the common frequency clock signal propagation path. However, the delay matching may be inaccurate in different operating conditions and across variations in the manufacturing process.

Furthermore, frequency dividers with two signal propagation paths, a model delay element, and a multiplexer to select between the two signal propagation paths may consume a large amount of power and introduce a relatively large propagation delay into both clock signal propagation paths (for example, a six gate delay). The large amount of power and the relatively large propagation delay may be unacceptable in some applications.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
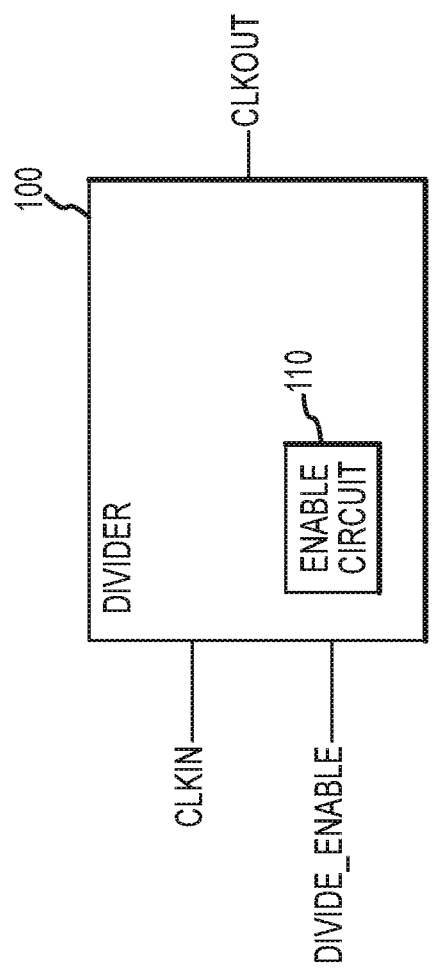
FIG. 1 is a block diagram of a frequency divider according to an embodiment of the present invention.

FIG. 1 illustrates a frequency divider 100. A CLKTN signal and a DIVIDE_ENABLE signal are both provided to the frequency divider 100. In response, the frequency divider 100 provides a CLKOUT signal. The CLKIN signal may be a reference clock signal, and may have a reference clock frequency. The DIVIDE_ENABLE signal indicates whether the frequency divider 100 should provide a common frequency clock signal having the same clock frequency as the CLKOUT signal (with a slight propagation delay) or provide a reduced frequency clock signal as the CLKOUT signal (also with a slight propagation delay). The reduced frequency clock signal may be the reference clock signal frequency divided by an integer such as 2, 3, 4, 6, and so forth. The CLKOUT signal may be utilized by a circuit coupled to the frequency divider 100, such as a memory or a DLL.

The DIVIDE_ENABLE signal is provided to an enable circuit 110 to control the frequency divider 100 to provide the common frequency clock signal or the reduced frequency clock signal as the CLKOUT signal.

The frequency divider 100 is configured to provide the common frequency clock signal and the reduced frequency clock signal as the CLKOUT signal with substantially the same propagation delay (e.g., within +/−10% of one another). The frequency divider 100 provides the common frequency clock signal and the reduced frequency clock signal with substantially the same propagation delay because the frequency divider 100 uses at least one shared circuit to provide the common frequency clock signal and the reduced frequency clock signal. For example, the frequency divider 100 may provide both the common frequency clock signal and the reduced frequency clock signal through a shared field effect transistor (FET) and/or through a shared gate or other circuit(s). By providing both signals through at least one shared circuit, the frequency divider 100 is able to provide the signals with substantially the same propagation delay (with no need to match the delays as the signals propagates through a shared circuit), and further needs less circuitry to propagate both clock signals.

Figure 2:
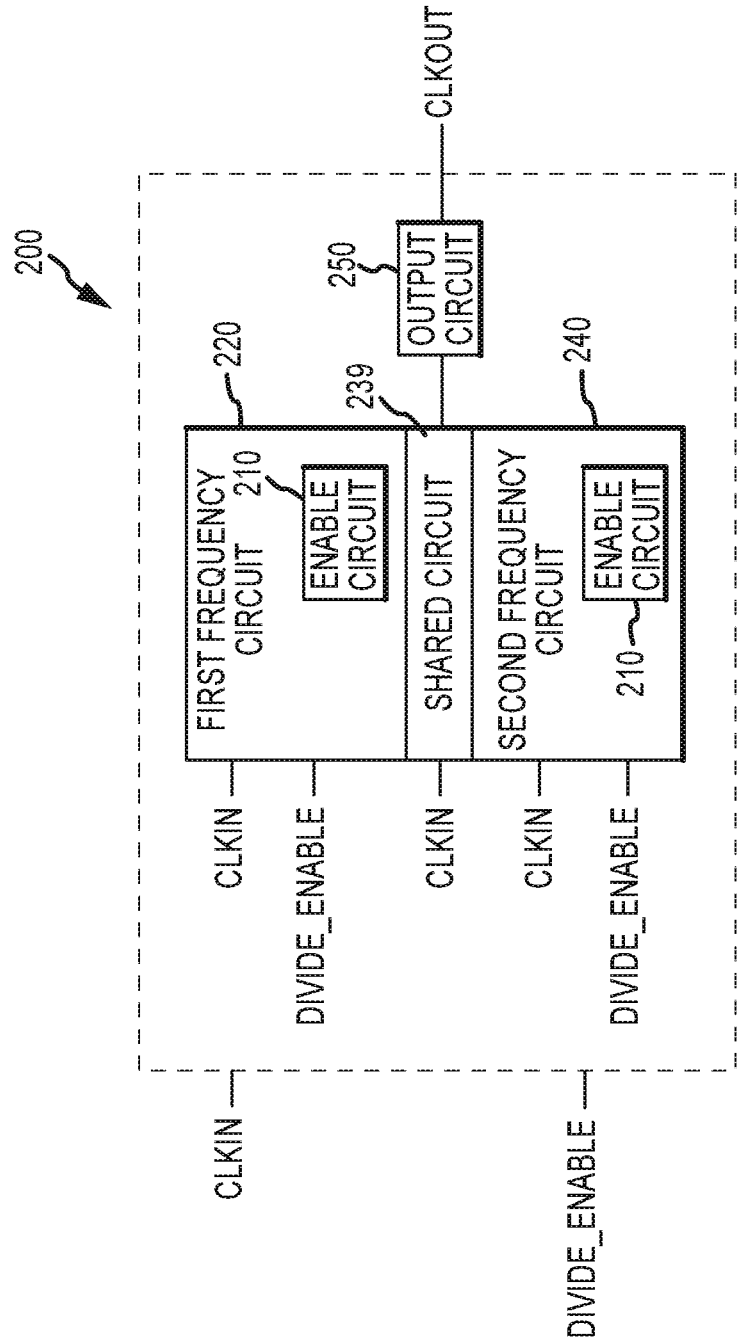
FIG. 2 is a block diagram of a frequency divider according to an embodiment of the invention.

FIG. 2 illustrates one embodiment of a frequency divider 200 that may be used for the frequency divider 100 in FIG. 1. Similar to the frequency divider 100 in FIG. 1, CLKIN and DIVIDE_ENABLE signals are provided to the frequency divider 200, which in response provides a CLKOUT signal. The frequency divider 200 in FIG. 2 includes a first frequency circuit 220, and a second frequency circuit 240, which share at least one circuit in a shared circuit 239. The first and second frequency circuits include an enable circuit 210. The frequency divider 200 also includes an output circuit 250.

The CLKIN signal is provided to the first frequency circuit 220, which selectively, provides a first clock signal in response. In some embodiments, the DIVIDE_ENABLE signal is also provided to the first frequency circuit 200. The first clock signal may have the same frequency as the CLKIN signal. The CLKIN signal and the DIVIDE_ENABLE signal are provided to the second frequency circuit 240, which selectively provides a second clock signal in response. The second clock signal may have a lower frequency than the CLKIN signal. The first and second frequency circuits may share at least one circuit through which the first and second clock signals are provided. As such, the first and second frequency, circuits 220, 240 may have substantially the same propagation delay.

The frequency divider 200 illustrated in FIG. 2 also includes an output circuit 250 coupled to the first and second frequency circuits 220, 240 and through which the first and second clocks signals may be selectively provided. In other embodiments, however, the output circuit 250 may be included in the first and/or second frequency circuit 220, 240.

Figure 3:
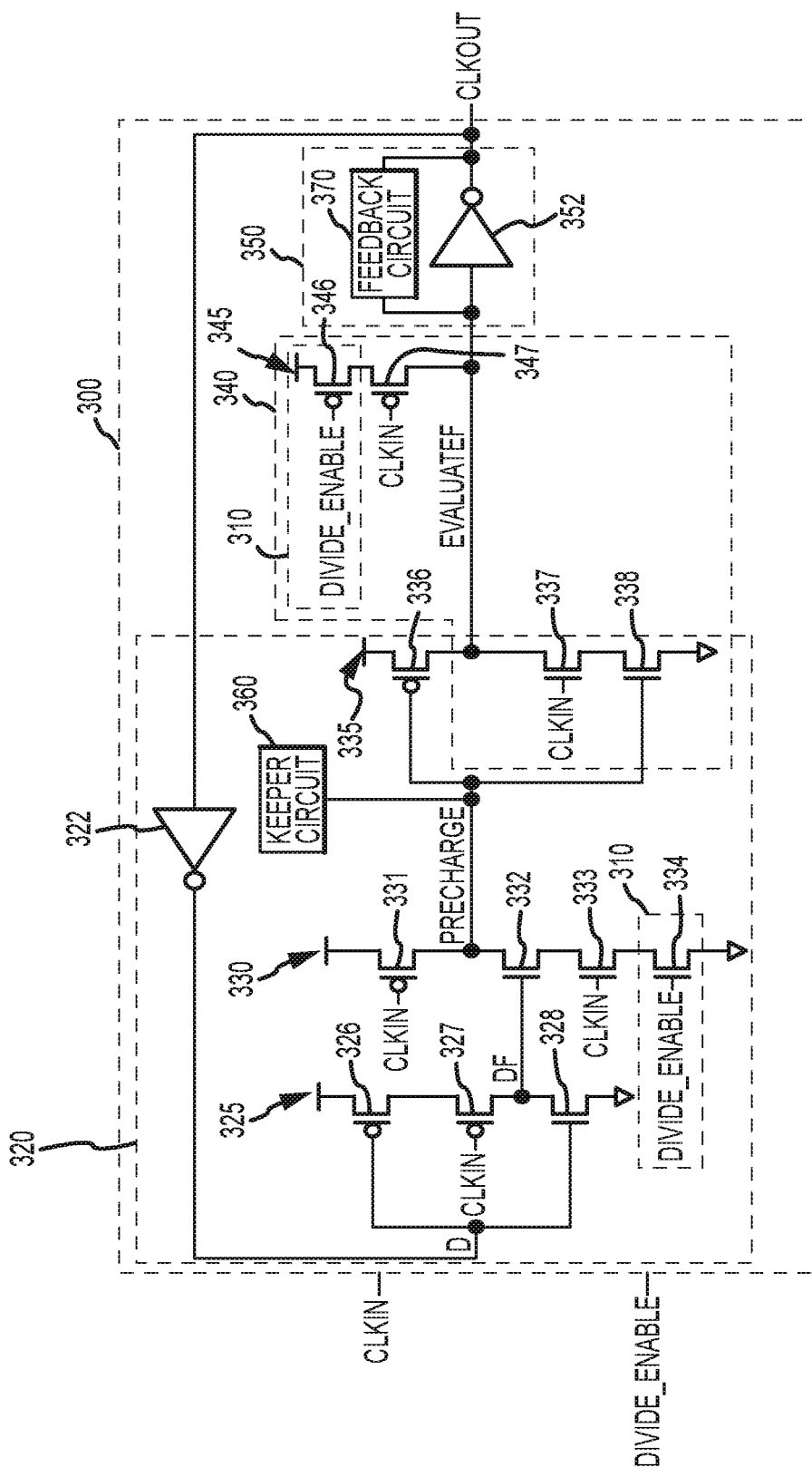
FIG. 3 is a schematic diagram of a frequency divider according to an embodiment of the invention.

FIG. 3 illustrates a schematic diagram of a divider 300 that may be used for the frequency divider 100 in FIG. 1 and/or the frequency divider 200 in FIG. 2. Similar to the frequency dividers 100, 200 in FIGS. 1 and 2, a CLKIN signal and a DIVIDE_ENABLE signal are provided to the frequency divider 300 in FIG. 3, and the frequency divider 300 provides a CLKOUT signal in response. Similar to the frequency divider 200 in FIG. 2, the frequency divider 300 in FIG. 3 includes a first frequency circuit 320 and a second frequency circuit 340, which share at least one circuit. The frequency divider 300 also includes an output circuit 350 coupled to the first and second frequency circuits 320, 340.

The first frequency circuit 320 includes an inverter 322, a first group of FETs 325, a second group of FETs 330, and a third group of FETs 335. The CLKOUT signal is provided to input of the inverter 322, which in response provides a D signal at its output. The first group of FETs 325 includes two p-channel FETs (pFETs) 326, 327, and an n-channel FET (nFET) 328 coupled in series between a supply voltage node, such as VCC, and a reference voltage node, such as ground. The D signal is provided to the gates of the pFET 326 and the nFET 328, and the CLKIN signal is provided to the gate of the pFET 327. The first group of FETs 325 provides a DF signal at the node between the drain of the pFET 327 and the source of the nFET 328 in response.

The second group of FETs 330 includes a pFET 331 and three nFETs 332, 333, 334 coupled in series between a supply voltage node, such as VCC, and a reference voltage node, such as ground. The CLKIN signal is provided to the gates of the pFET 331 and the nFET 333, and the DF signal from the first group of FETs 325 is provided to the gate of the nFET 332. The DIVIDE_ENABLE signal is provided to the gate of the nFET 334, which may form at least a portion of an enable circuit 310 in the first frequency circuit 320. The second group of FETs provides a PRECHARGE signal at the node between the drain of the pFET 331 and the drain of the nFET 332 in response.

The third group of FETs 335 includes a pFET 336 and two nFETs 337, 338 coupled in series between a supply voltage node, such as VCC, and a reference voltage node, such as ground. The CLKIN signal is provided to the gate of the nFET 337, and the PRECHARGE signal is provided to the gates of the pFET 336 and the nFET 338. The third group of FETs provides an EVALUATEF signal at the node between the drain of the pFET 336 and the drain of the nFET 337 in response.

In some embodiments, the first frequency circuit 320 may include a keeper circuit 360. For example, a keeper circuit 360 may be coupled to the PRECHARGE signal node in order to maintain the voltage on that node and prevent that node from floating to an invalid logic level. A keeper circuit 360 may be included, for example, if the frequency of the CLKIN signal is relatively slow (e.g., slow enough to allow the PRECHARGE signal to be discharged by leakage or slow enough to allow the PRECHARGE signal to drift) and/or if the CLKIN signal can be temporarily halted (which again may cause leakage or drift of the PRECHARGE signal). In dividers 300 where the frequency of the CLKIN signal is sufficiently fast so as to prevent discharge or drift of the PRECHARGE node, however, a keeper circuit may not be included in some embodiments.

When in use, the first frequency circuit 320 may be similar to a toggle flip-flop implemented in dynamic logic when used in conjunction with the output circuit 350, which is described in more detail below. The first frequency circuit 320 may thus be used to provide a reduced frequency clock signal as the CLKOUT signal. As illustrated in FIG. 3, the first frequency circuit 320 is configured to divide the frequency of the CLKIN signal by a factor of 2, and provide the CLKOUT signal at a frequency that is half the frequency of the CLKIN signal, with a first propagation delay.

The second frequency circuit 340 includes a fourth group of FETs 345 and some of the FETs from the third group of FETs 335 in the first frequency circuit 320. The fourth group of FETs 345 includes two pFETs 346, 347 coupled in series between a supply voltage node, such as VCC, and the EVALUATEF signal node (i.e., the node between the drain of the pFET 336 and the nFET 337). The DIVIDE_ENABLE signal is provided to the gate of the pFET 346, which may form at least a portion of an enable circuit 310 in the second frequency circuit 340. The CLKIN signal is provided to the gate of the pFET 347. As illustrated in FIG. 3, in some embodiments, the second frequency circuit 340 shares at least nFET 337 with the first frequency circuit 320.

When in use, the second frequency circuit 340 may be similar to a tri-state inverter when the pFET 336 in the third group of FETs is not conductive. Thus, as illustrated in FIG. 3, the second frequency circuit 340 is configured to provide the CLKOUT signal at the same frequency as the CLKIN signal, with a second propagation delay that is substantially the same as the first propagation delay of the first frequency circuit 320.

The output circuit 350 includes an inverter 352. The EVALUATEF signal is provided to the input of the inverter 352 and the inverter 352 provides the CLKOUT signal in response. The output circuit 350 may also in some embodiments include a feedback circuit 370 to help avoid fighting on the EVALUATEF signal node and ensure that the EVALUATEF signal node does not float to an invalid logic level. In this manner, the frequency divider 300 can be used, for example, to drive subsequent static logic gates in addition to or in place of subsequent dynamic logic gates. In general, the feedback circuit 370 may be a simple unclocked feedback circuit, a clocked feedback circuit, or another type of feedback circuit. In some embodiments, the feedback circuit 370 may help reduce the propagation delay of signals through the output circuit 350.

As mentioned above, the frequency divider 300 includes one or more enable circuit(s) 310 that receive the DIVIDE_ENABLE signal to enable the frequency divider 300 to provide a common frequency clock signal or the reduced frequency clock signal as the CLKOUT signal. The enable circuit(s) 310 in conjunction with the other components of the frequency divider 300 thus provide a function similar to a multiplexer, except that the enable circuit(s) may not introduce additional propagation delay into the signal propagation paths, as a multiplexer typically does.

As illustrated in FIG. 3, portions 320, 350 of the frequency divider 300 may be viewed as a dynamic flip-flop with an inverter coupling its output to its input in order to allow the dynamic flip-flop to divide the frequency of a reference clock signal in half and to thus provide the reduced frequency clock signal, and portions 340, 350 may be viewed as a buffer (including a tri-state inverter and a regular inverter) that allow the frequency divider to buffer the reference clock signal without dividing its frequency in half and provide the common frequency clock signal. In other words, the frequency divider 300 may be viewed as a dynamic toggle flip-flop with additional circuits 334, 346, 347, 360, 370 that allow the frequency divider 300 to propagate the reference clock signal without dividing its frequency in half as the common frequency clock signal. The additional circuits 334, 346, 347, 360, 370 are configured such that the common frequency and reduced frequency clock signals propagate through the same, shared circuits 337, 352, hence providing the same propagation delay for the common frequency and reduced frequency clock signals. In still other words, the additional circuits 334, 346, 347, 360, 370 are configured such that the enable circuit(s) 310 can selectively disable the dynamic toggle flip-flop and override its output with the common frequency clock signal.

In addition to including at least one shared circuit between the first and second frequency circuits 320, 340, each of the first and second frequency circuits 320, 340 may include one or more additional circuits through which the circuits 320, 340 selectively, provide the common frequency clock signal and the reduced frequency clock signal. These one or more additional circuits may be substantially similar to one another in some embodiments in order to ensure that the propagation delay of the first and second frequency circuits 320, 340 is substantially the same.

The frequency divider 300 may operate differently depending on the logic level of the DIVIDE_ENABLE signal. When the DIVIDE_ENABLE signal is logic low, the frequency divider 300 provides a common frequency clock signal as the CLKOUT signal (effectively operating as a buffer), whereas when the DIVIDE_ENABLE signal is logic high, the frequency divider 300 provides the reduced frequency clock signal as the CLKOUT signal (effectively operating as a dynamic toggle flip-flop). In both modes of operation, the frequency divider 300 provides the CLKOUT signal with substantially the same propagation delay regardless of whether the common frequency clock signal or the reduced frequency, clock signal is provided as the CLKOUT signal. In some embodiments, the frequency divider 300 may provide the CLKOUT signal with a two gate propagation delay for both the common frequency clock signal and for the reduced frequency clock signal.

In operation when the DIVIDE_ENABLE signal is logic low, the nFET 334 of the enable circuit 310 is non-conductive but the pFET 346 of the enable circuit 310 is conductive. So long as the nFET 334 is non-conductive, the PRECHARGE signal node will remain at logic high because there is no path through the nFETs 332, 333, 334 to discharge the PRECHARGE signal node (which is driven to logic high through pFET 331 each time CLKIN is logic low, and which is maintained at logic high by the keeper circuit 360, when included). When the PRECHARGE signal node remains at logic high, the pFET 336 is non-conductive, and the nFET 338 is conductive. Furthermore, when DIVIDE is logic low, the pFET 346 is conductive. Therefore, when DIVIDE_ENABLE is logic low, the FETs 346, 347, 337, 338 function similarly to a tri-state inverter with the FETs 346 and 338 both always staying conductive so long as the DIVIDE_ENABLE signal is logic low. Thus the FETs 347, 337 invert the CLKIN signal and provide the inverted signal to the EVALUATEF signal node. Then the inverter 352 in the output circuit 350 inverts the EVALUATEF signal and provides the inverted EVALUATEF signal to the CLKOUT node. Thus, the total propagation delay of the common frequency clock signal through the tri-state inverter formed by FETs 346, 347, 337, 338, and the inverter 352, is a two gate delay.

In operation when the DIVIDE_ENABLE signal is logic high, the pFET 346 of the enable circuit 310 is non-conductive but the nFET 334 of the enable circuit 310 is conductive. So long as the pFET 346 is non-conductive, the group of transistors 345 will not affect the EVALUATEF signal node or affect the operation of any other portion of the frequency divider 300. Also, so long as the nFET 334 is conductive, the first, second, and third groups of transistors 325, 330, 335 will function together with the output circuit 350 as a dynamic toggle flip-flop, dividing the frequency of the CLKIN signal and providing the reduced frequency clock signal as the CLKOUT signal. For example, when the CLKIN signal is logic low, the D signal is inverted by the first group of transistors 325 and provided as the DF signal to the second group of transistors 330. The pFET 331 of the second group of transistors 330 also causes the PRECHARGE signal node to be precharged to logic high when the CLKIN signal is logic low, which in turn causes the pFET 336 to be non-conductive and the nFET 338 to be conductive. Then, once the CLKIN signal transition to logic high, the DF signal is "evaluated" in that nFET 332 selectively discharges the PRECHARGE signal node to logic low when the DF signal is logic high and selectively maintains the PRECHARGE signal node at logic high when the DF signal is logic low. Then, depending on the logic level of the PRECHARGE signal node, the rising edge of the CLKIN signal will either charge or maintain the EVALUATEF signal node as logic high, or discharge the EVALUATEF signal node to logic low. In this manner, the first frequency, circuit 320 operates as a high divider because only the rising edge of the CLKIN signal can cause the CLKOUT signal to change. When the DIVIDE_ENABLE signal is logic high, the total propagation of the reduced frequency clock signal is a two gate delay from the rising CLKIN signal to the rising CLKOUT signal because the nature of the dynamic logic is such that each time the CLKIN signal is logic low, the PRECHARGE signal node is precharged to logic high, which allows the propagation delay of the reduced frequency clock signal to only include the delay through the third group of transistors 335 and the output circuit 350. As illustrated by the previous description, the propagation delay between the CLKIN and CLKOUT signal is a two gate delay for both modes of operation of the divider 300.

Figure 4:
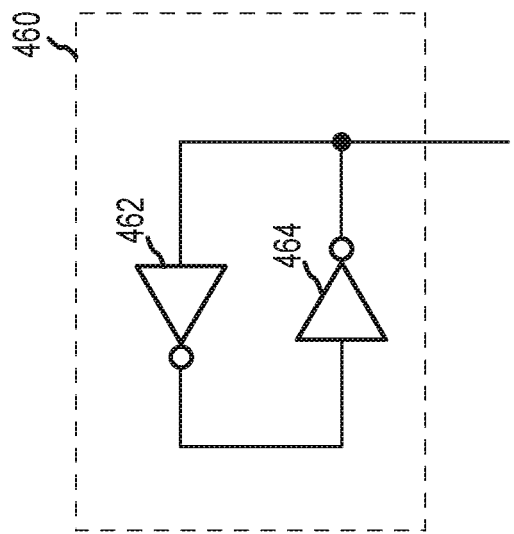
FIG. 4 is a schematic diagram of a keeper circuit according to an embodiment of the invention.

FIG. 4 illustrates one embodiment of a keeper circuit 460 that may be used as the keeper circuit 360 in FIG. 3. The keeper circuit 460 in FIG. 4 includes first and second inverters 462 and 464, with the output of the first inverter 462 coupled to the input of the second inverter 464 and the output of the second inverter 464 coupled to the input of the first inverter 462. The output of the second inverter 464 may be coupled to the PRECHARGE signal node in FIG. 3 in order to "keep" (e.g., maintain) a voltage provided to that node and prevent the voltage from changing due to, for example, charge leaking away through parasitic circuits, noise, and so forth. The first inverter 462 may be a regular inverter with a regular drive strength, and the second inverter 464 may be a relatively weak inverter with a reduced drive strength. For example, the second inverter 464 may have approximately half the drive strength as the first inverter 462 in some embodiments. The second inverter 464 may have a relatively weak drive strength in order to allow the "keeping" function to be overcome when an intended change in voltage is provided to the PRECHARGE node (e.g., the PRECHARGE node is charged to logic high because the pFET 331 is made conductive or the PRECHARGE node is discharged to logic low because the nFETs 332, 333, 334 are made conductive). The second inverter 464 may have a relatively weak drive strength due to it having stacked devices (e.g., two pFETs and two nFETs coupled in series with the outermost pFET and nFET semi-permanently enabled), due to the use of a pFET and/or an nFET with a longer channel than normal FETs, due to the use of a thicker oxide material in the pFET and/or the nFET, and so forth.

Figure 5:
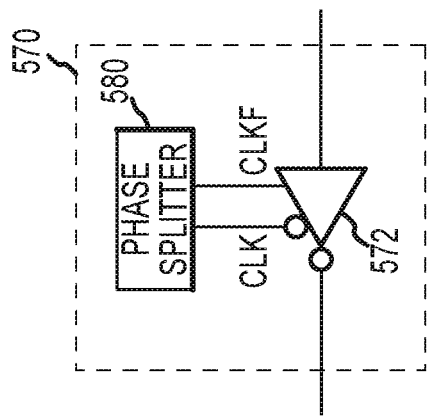
FIG. 5 is a schematic diagram of a feedback circuit according to an embodiment of the invention.

FIG. 5 illustrates one embodiment of a feedback circuit 570 that may be used as the feedback circuit 370 in FIG. 3. When used as the feedback circuit 370 in FIG. 3, the feedback circuit 570 may help avoid fighting on the EVALUATEF signal node and may also help ensure that the EVALUATEF signal node does not float.

The feedback circuit 570 in FIG. 5 includes an inverter 572 and a phase splitter 580. The phase splitter 580 provides two clock polarities CLK and CLKF in response to a single phase clock (such as CLKIN in FIG. 3), which can be used to clock the feedback circuit 570. The inverter 572 of the feedback circuit 570 is clocked by the CLK and CLKF signals and may be a tri-state inverter in some embodiments. The inverter 572 may thus invert the signal provided to its input when the CLK and CLKF signals enable the inverter 572 and may have a high impedance when the CLK and CLKF signals disable the inverter 572. By providing a clocked feedback for the feedback circuit 570 (as opposed to a non-clocked, simple feedback circuit), the feedback circuit 570 may help reduce the propagation delay through the output circuit 350 in FIG. 3, although this reduction in propagation delay comes at the expense of the additional power and area for the phase splitter 580. However, as explained in more detail below, the phase splitter 580 need not be a full-strength phase splitter in some embodiments, but instead may be a low-power, relatively small and simple phase splitter. Furthermore, because the phase splitter 580 is not directly in the propagation path for the CLKOUT signal, the propagation delay added to the CLKIN signal in generating the CLK and CLKF signals does not add to the overall propagation delay for the CLKOUT signal.

Figure 6A:
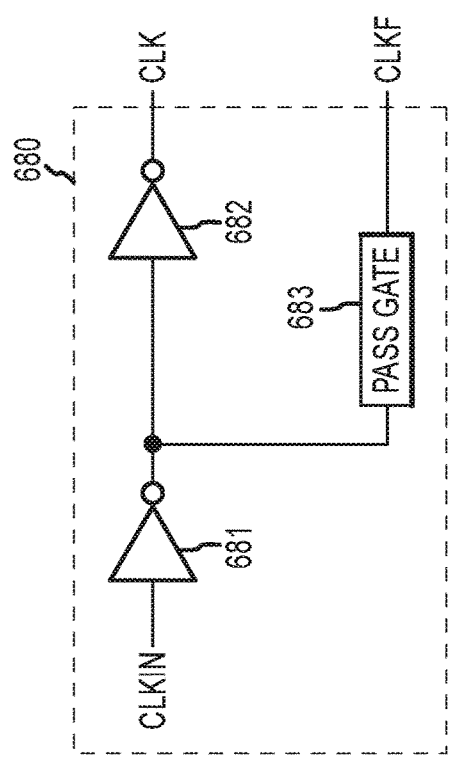
FIG. 6A is a schematic diagram of a phase splitter according to an embodiment of the invention.

FIG. 6A illustrates an embodiment of a phase splitter 680 that may be used for the phase splitter 580 in FIG. 5. The phase splitter 680 in FIG. 6A receives the signal CLKIN, and propagates this received signal through two different paths. As illustrated in FIG. 6A, the signal CLKIN is propagated through first and second inverters 681, 682 in order to provide the first signal CLK, and is propagated through the first inverter 681 and a pass gate 682 to provide the second signal CLKF. The inverter 682 and the pass gate 683 may be configured (e.g., designed with an appropriate drive strength) such that the propagation delay of the two different paths is substantially the same (e.g., within +/−10%). The phase splitter 680 illustrated in FIG. 6A may have approximately a two gate propagation delay and may consume about as much power as two gates when transitioned at full-frequency.

Figure 6B:
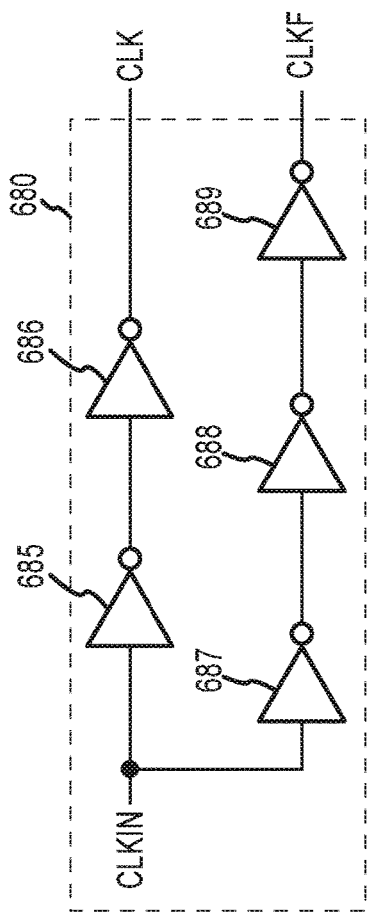
FIG. 6B is a schematic diagram of a phase splitter according to an embodiment of the invention.

FIG. 6B illustrates another embodiment of a phase splitter 680. The phase splitter 680 illustrated in FIG. 6B may be used for the phase splitter 580 in FIG. 5. Like the phase splitter illustrated in FIG. 6A, the phase splitter illustrated in FIG. 6B receives the signal CLKIN, and propagates this received signal through two different paths. As illustrated in FIG. 6B, the signal CLKIN is propagated through first and second inverters 685, 686 in order to provide the first signal CLK, and is propagated through third, fourth, and fifth inverters 687, 688, 689 in order to provide the second signal CLKF. The inverters 685, 686, 687, 688, 689 may be configured such that the propagation delays of the two different paths are substantially the same (e.g., within +/−10%). The phase splitter 680 illustrated in FIG. 6B may have approximately a two gate propagation delay and may consume about as much power as five gates when transitioned at full-frequency. Although the phase splitter 680 illustrated in FIG. 6B may have a better phase split accuracy than the phase splitter 680 illustrated in FIG. 6A, the better accuracy comes at the expense of additional power and area. Either the phase splitter 680 illustrated in FIG. 6A or the phase splitter 680 illustrated in FIG. 6B may be used as the phase splitter 580 in the feedback circuit 570 of FIG. 5.

Figure 7:
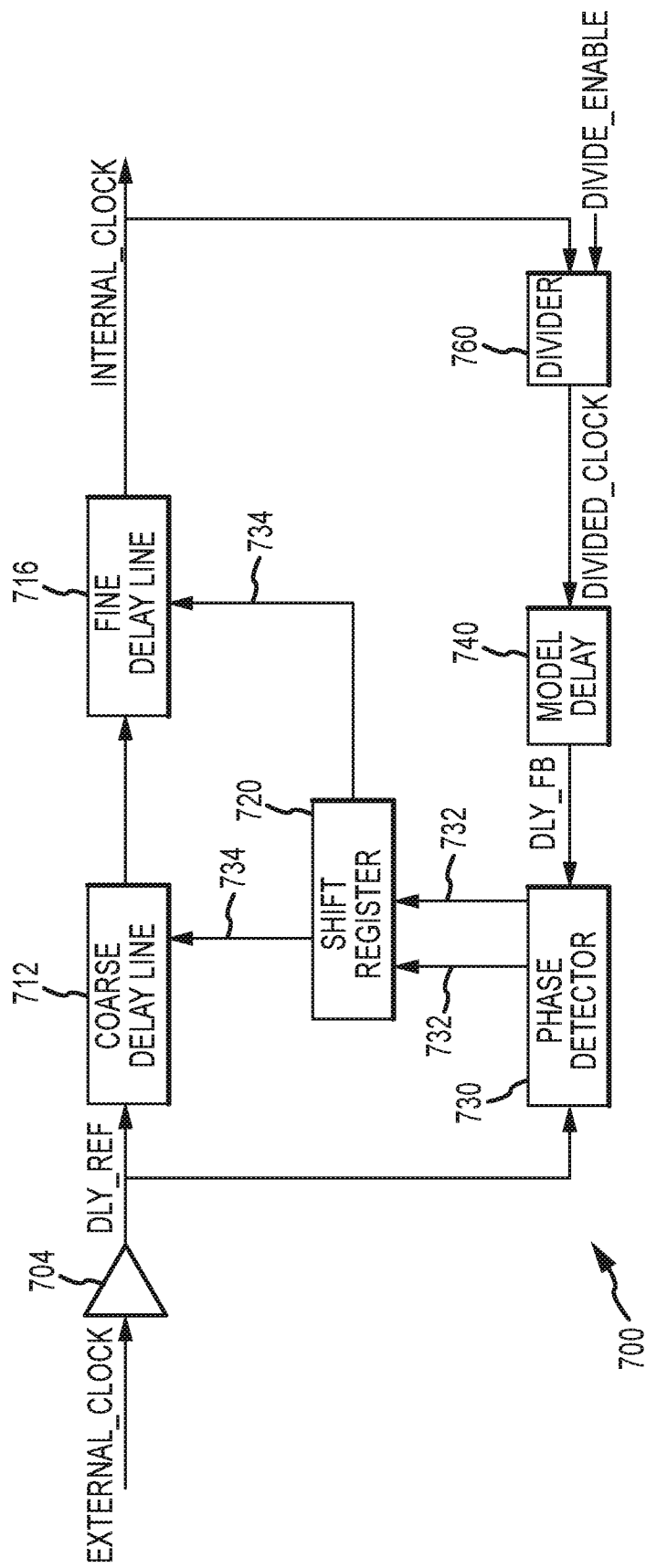
FIG. 7 is a block diagram of a delay-locked loop (DLL) according to an embodiment of the invention.

FIG. 7 illustrates a DLL circuit 700 for providing an approximate delay that matches the phase difference between input and output clock signals. The DLL circuit 700 uses a feedback configuration that operates to feed back a phase difference-related signal to control one or more delay lines, such as a coarse delay line 712 and/or a fine delay line 716, for advancing or delaying the timing of one clock signal to "lock" to a second clock signal. The DLL 700 may include a frequency divider 760 that may help reduce power consumption in the DLL.

An EXTERNAL_CLOCK signal is initially provided to the DLL circuit 700 and received by an input buffer 704 that provides a buffered clock signal DLY_REF to the DLL circuit 700. The DLY_REF signal is delayed relative to the external clock signal due to a propagation delay of the input buffer 704. The DLY_REF signal is then provided to coarse and fine delay lines 712, 716, which include a number of delay stages that are selected by a shift register 720 to provide a measured delay for adjusting the phase of the DLY_REF signal. The shift register 720 controls adjustments to the coarse and fine delay lines 712, 716 by providing shift control signals 734 in response to receiving control signals from a phase detector 730. In response to the shift control signals 734, the coarse delay line 712 provides a measured delay to adjust the phase of the DLY_REF signal near the desired phase for achieving the phase lock condition. The fine delay line 716 provides smaller delay, adjustments to "fine tune" the DLY_REF signal closer to the desired phase lock condition. The coarse and fine delay lines 712, 716 generate an output signal INTERNAL_CLOCK. After passing through a divider 760 and a model delay circuit 740 (both described below), the phase of the INTERNAL_CLOCK signal is compared to the DLY_REF signal to determine whether the locking condition has been achieved.

The INTERNAL_CLOCK signal and a DIVIDE_ENABLE signal are provided to the frequency divider 760. The frequency divider 760 may be any of the frequency dividers 100, 200, 300 illustrated in FIG. 1, 2, or 3, or a similar frequency divider. The frequency, divider 760 provides a DIVIDED_CLOCK signal in response to the INTERNAL_CLOCK and the DIVIDE_ENABLE signals. The DIVIDED_CLOCK signal may have a common frequency to the INTERNAL_CLOCK signal when the DIVIDE_ENABLE signal is logic low, and the DIVIDED_CLOCK signal may have a reduced frequency as compared with the INTERNAL_CLOCK signal frequency when the DIVIDE_ENABLE signal is logic high. As explained below, the INTERNAL_CLOCK signal is selectively divided by the frequency divider 760 in order to help reduce power consumption in the model delay circuit 740 of the DLL 700.

The DIVIDED_CLOCK signal is provided from the frequency divider 760 to the model delay circuit 740, which duplicates inherent delays added to the provided external clock signal as it propagates through the delay loop, such as the input buffer 704. The model delay circuit 740 then provides a feedback signal DLY_FB to the phase detector 730. The phase detector 730 compares the phases of the DLY_REF signal and the DLY_FB signal to generate shift selection signals 732 to the shift register 720 to control the coarse or fine delay lines 712, 716. The shift selection signal instructs the shift register 720 to increase the delay of the coarse or fine delay lines 712, 716 when the DLY_FB signal leads the DLY_REF signal, or decrease the delay in the opposite case.

The frequency divider 760 is configured so that the propagation delay of the INTERNAL_CLOCK signal through the frequency divider is substantially the same regardless of whether the frequency divider 760 provides a common frequency clock signal as the DIVIDED_CLOCK signal or whether it provides a reduced frequency clock signal as the DIVIDED_CLOCK signal. The propagation delay through the frequency divider 760 may need to be the same in both cases because otherwise the DLL 700 may be unable to maintain the DLL lock if the frequency divider alternates between providing the common frequency clock signal as the DIVIDED_CLOCK signal and providing the reduced frequency clock signal as the DIVIDED_CLOCK signal, or vice versa.

Furthermore, the frequency divider 760 is configured so that the propagation delay is relatively short (e.g., a two gate delay). The propagation delay through the frequency divider 760 may need to be relative short because the propagation delay may need to, in connection with the model delay circuit 740, model a part of the DLL forward path. Although the frequency divider 760 is illustrated in FIG. 7 as being distinct from the model delay circuit 740, in other embodiments, the frequency divider 760 may be included within the model delay circuit 740.

In operation, the frequency divider 760 may be used to reduce power consumption in the model delay circuit 740 and/or in other parts of the DLL 700. In one embodiment of the DLL. 700, the frequency divider 760 provides the common frequency clock signal as the DIVIDED_CLOCK signal (with a slight propagation delay) while the INTERNAL_CLOCK signal is locked with the EXTERNAL_CLOCK signal. Once the lock is achieved, the frequency divider 760 provides the reduced frequency clock signal as the DIVIDED_CLOCK signal, with the reduced frequency clock signal having half the frequency of the INTERNAL_CLOCK signal. The reduced frequency of the DIVIDED_CLOCK signal may help reduce power consumption in the model delay circuit 740 and/or other areas of the DLL 700 due to the less frequent transitioning of devices and the accompanying reduction in dynamic power consumed.

Figure 8:
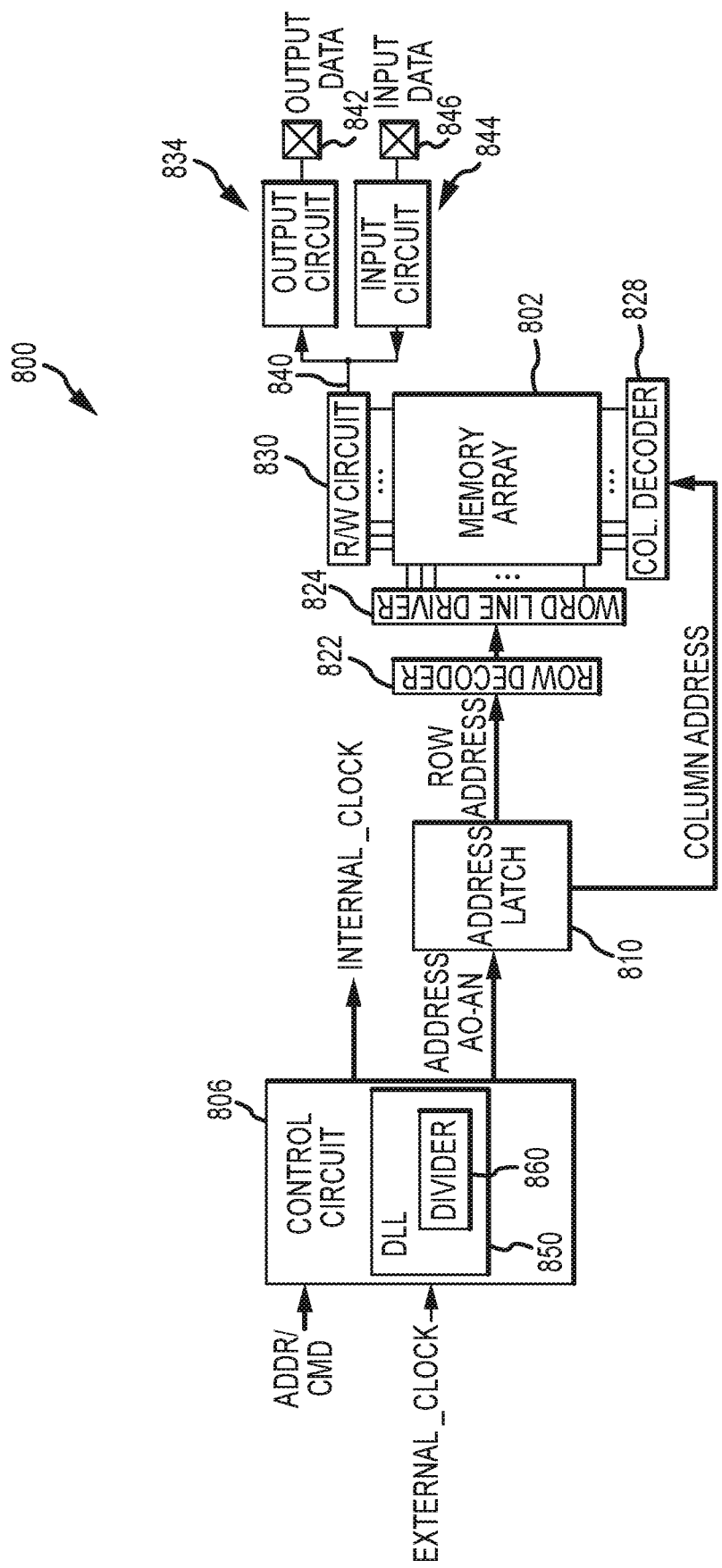
FIG. 8 is a block diagram of a memory according to an embodiment of the invention.

FIG. 8 illustrates a portion of a memory 800 according to an embodiment of the present invention. The memory 800 includes an array 802 of memory cells, which may be, for example, DRAM memory cells, SRAM memory cells, flash memory cells, or some other types of memory cells. The memory 800 includes a control circuit 806 that receives memory, commands and addresses through an ADDR/CMD bus. The control circuit 806 provides control signals, based on the commands received through the ADDR/CMD bus. The control circuit 806 also provides row and column addresses to the memory 800 through an address bus and an address latch 810. The address latch then outputs separate column addresses and separate row addresses.

The row and column addresses are provided by the address latch 810 to a row address decoder 822 and a column address decoder 828, respectively. The column address decoder 828 selects bit lines extending through the array 802 corresponding to respective column addresses. The row address decoder 822 is connected to word line driver 824 that activates respective rows of memory cells in the array 802 corresponding to received row addresses. The selected data line (e.g., a bit line or bit lines) corresponding to a received column address are coupled to a read/write circuitry 830 to provide read data to a data output circuit 834 via an input-output data bus 840. An output pad 842 coupled to the data output circuit 834 is used for electrically coupling to the memory 800. Write data are provided to the memory array 802 through a data input circuit 844 and the memory array read/write circuitry 830. An input pad 846 coupled to the data input circuit 842 is used for electrically coupling to the memory 800. The control circuit 806 responds to memory commands and addresses provided to the ADDR/CMD bus to perform various operations on the memory array 802. In particular, the control circuit 806 is used to provide internal control signals to read data from and write data to the memory array 802.

The control circuit 806 in FIG. 8 also includes a DLL 850 that may be, for example, the DLL 700 described herein in connection with FIG. 7, or a similar DLL. The DU 850 may include a divider 860 that may be the frequency divider 100, 200, 300, 760 described herein, or a similar divider. The frequency divider 860 may be configured to alternate between providing common frequency and reduced frequency clock signals and providing the respective common frequency and reduced frequency clock signals to the DLL 800.

From the foregoing it will be appreciated that, although specific embodiments of the invention have been described herein for purposes of illustration, various modifications may be made without deviating from the spirit and scope of the invention. For example, FIGS. 1, 2, 3, 7, and 8 illustrate embodiments 100, 200, 300, 760, 860 of a frequency divider, FIGS. 1, 2, 3 illustrate embodiments 110, 210, 310 of an enable circuit, FIGS. 2 and 3 illustrate embodiments of first and second frequency circuits 220, 320, 240, 340, FIGS. 2 and 3 illustrate embodiments 250, 350 of an output circuit, FIGS. 3 and 4 illustrate embodiments 360, 460 of a keeper circuit, FIGS. 3 and 5 illustrate embodiments 370, 570 of a feedback circuit, and so forth. However, other frequency dividers, enable circuits, first and second frequency circuits, output circuits, keeper circuits, feedback circuits, and so forth may be used, which are not limited to having the same design, and may be of different designs and include circuitry different from the circuitry in the embodiments illustrated in these Figures.

Furthermore, although FIG. 3 illustrates an embodiment of a frequency divider that includes the elements of a rising-edge triggered dynamic flip-flop, a falling-edge triggered dynamic flip-flop, or a different kind of dynamic or other flip-flop or other type of latching element may be used in place of or in addition to the elements of a rising-edge triggered dynamic flip-flop in FIG. 3. Also, although FIG. 3 illustrates a frequency divider that alternates between providing the output clock signal as a common frequency clock signal and as a reduced frequency clock signal with half the frequency of the reference clock signal, the frequency dividers described herein may also or alternatively provide reduced frequency clock signals with other factors from the reference clock signal frequency, such as ⅓, ¼, ⅙, ⅛ of the reference clock frequency, and so forth. In some embodiments, the frequency, divider may be configured to provide a selection from more than one reduced clock frequencies depending on the enable signal.

Also, although FIGS. 7 and 8 illustrate the use of a frequency divider within a the frequency dividers described herein may also be used in any of a number of different circuits and is not limited to use within a DLL or within a memory.

Accordingly, the invention is not limited except as by the appended claims.

What is claimed is:

1. An apparatus comprising:
first and second power lines;
an output circuit;
a first circuit including a plurality of first transistors coupled between the first power line and the output circuit, the plurality of first transistors including a first enable circuit provided with a divide enable signal; and
a second circuit including a plurality of second transistors coupled between the output circuit and the second power line, the plurality of second transistors including a second enable circuit provided with the divide enable signal;
wherein the first circuit is configured to provide a first clock signal to the output circuit responsive to a reference clock signal and an active divide enable signal provided to the first enable circuit,
wherein the second circuit is configured to provide a second clock signal to the output circuit responsive to the reference clock signal and an inactive divide enable signal provided to the second enable circuit, and
wherein the first and second clock signals have a first frequency, and a second frequency that is different from the first frequency, respectively.

2. The apparatus of claim 1, wherein each transistor of the plurality of first transistors is of a first conductivity type.

3. The apparatus of claim 2, wherein each transistor of the plurality of second transistors is of a second conductivity type.

4. The apparatus of claim 1, further comprising a third transistor coupled to the output circuit via a first node,
wherein output of the first circuit and output of the second circuit are coupled to the output circuit via the first node.

5. The apparatus of claim 1, wherein:
gates of the plurality of first transistors are configured to input the divide enable signal and the reference clock signal, respectively, and
a frequency of the reference clock signal is the first frequency.

6. The apparatus of claim 5, wherein:
the second circuit is configured to input a precharge signal and the reference clock signal, and
divide the first frequency of the reference clock signal to provide the second frequency.

7. The apparatus of claim 1, further comprising:
a first frequency circuit including the plurality of first transistors; and
a second frequency circuit including the plurality of second transistors,
wherein a frequency of the reference clock signal is the first frequency,
wherein the first frequency circuit is configured to provide the first clock signal at the first frequency, and
wherein the second frequency circuit is configured to divide the first frequency to provide the second frequency, and provide the second clock signal at the second frequency.

8. The apparatus of claim 7, wherein the first and second frequency circuits are configured to provide the first and second clock signals, respectively, with substantially a same propagation delay.

9. The apparatus of claim 1, further comprising:
a first frequency circuit including the plurality of first transistors; and
a second frequency circuit including the plurality of second transistors,
wherein the first and second frequency circuits are configured to provide the first and second clock signals, respectively, with substantially a same propagation delay.

10. The apparatus of claim 1, wherein one transistor of each of the plurality of first transistors and the plurality of second transistors is coupled to receive the reference clock signal,
wherein the plurality of first transistors are configured to be controlled to provide the first clock signal based on the reference clock signal received by the one transistor of the plurality of first transistors when enabled in a first operation mode, and
wherein the plurality of second transistors are configured to provide the second clock signal based on the reference clock signal received by the one transistor of the plurality of second transistors when enabled in a second operation mode.

11. An apparatus comprising:
a clock circuit including:
a first node configured to provide an output clock signal;
a pair of first transistors coupled to the first node and configured to be controlled by a first enable circuit provided with a divide enable signal and further configured to provide the output clock signal that has a first frequency responsive to an input clock signal and an active divide enable signal provided to the first enable circuit, and
  a pair of second transistors coupled to the first node and configured to be controlled by a second enable circuit provided with the divide enable signal and further configured to provide the output clock signal that has a second frequency responsive to the input clock signal and an inactive divide enable signal provided to the second enable circuit, wherein the second frequency is lower than the first frequency.

12. The apparatus of claim 11, wherein each transistor of the pair of first transistors is of a first conductivity type, and each transistor of the pair of second transistors is of a second conductivity type.

13. The apparatus of claim 11, wherein a gate of one transistor of the pair of first transistors is configured to receive the input clock signal, and
  wherein the pair of first transistors are configured to be controlled to provide the output clock signal at the first frequency based on the received input clock signal in a first operation mode.

14. The apparatus of claim 13, wherein a gate of one transistor of the pair of second transistors is configured to receive the input clock signal, and
  wherein the pair of second transistors are configured to be controlled to provide the output clock signal at the second frequency based on the received input clock signal in a second operation mode.

15. The apparatus of claim 11, further comprising a third transistor coupled to the first node.

16. The apparatus of claim 15, wherein a gate of one transistor of the pair of second transistors is coupled to a second node, and the gate of the one transistor of the pair of second transistors is configured to input a precharge signal via the second node, and
  wherein a gate of the third transistor is coupled to the second node, and the gate of the third transistor is configured to input the precharge signal via the second node.

17. An apparatus comprising:
  a clock circuit including:
    first and second power lines;
    a first node configured to provide an output clock signal;
    first and second transistors coupled to the first node and configured to be controlled by a first enable circuit provided with a divide enable signal and further configured to provide the output clock signal that has a first frequency responsive to an input clock signal and an active divide enable signal provided to the first enable circuit, wherein a first frequency circuit including the first and second transistors is configured to operate at the first frequency in a first operation mode; and
    third and fourth transistors coupled to the first node and configured to be controlled by a second enable circuit provided with the divide enable signal and further configured to provide the output clock signal that has a second frequency responsive to the input clock signal and an inactive divide enable signal provided to the second enable circuit, wherein a second frequency circuit including the third and fourth transistors is configured to operate at the second frequency in a second operation mode, and
  wherein the first frequency is equal to a frequency of the input clock signal and the second frequency is different from the first frequency.

18. The apparatus of claim 17, wherein the second frequency is lower than the first frequency.

19. The apparatus of claim 17, wherein the first transistor is configured to be rendered conductive in the first operation mode and non-conductive in the second operation mode.

* * * * *